United States Patent [19]
Hulseweh

[11] 4,423,548
[45] Jan. 3, 1984

[54] METHOD FOR PROTECTING A SEMICONDUCTOR DEVICE FROM RADIATION INDIRECT FAILURES

[75] Inventor: Terry S. Hulseweh, Mesa, Ariz.

[73] Assignee: Motorola, Inc., Schaumburg, Ill.

[21] Appl. No.: 280,190

[22] Filed: Jul. 6, 1981

[51] Int. Cl.³ .............................................. H01L 21/56
[52] U.S. Cl. ........................................ 29/591; 29/589; 29/588; 357/84
[58] Field of Search ................. 29/571, 589, 590, 591, 29/588; 357/29, 84; 365/53

[56] References Cited

FOREIGN PATENT DOCUMENTS

| 54-387 | 1/1979 | Japan | 357/84 |
| 55-93239 | 7/1980 | Japan | 357/29 |
| 8002891 | 12/1980 | PCT Int+1 Appl. | 357/84 |

OTHER PUBLICATIONS

Thun, R. E., "Deposited, Noise-Reducing Ground Plane" in *IBM-T.D.B.*, vol. 10, No. 1, Jun. 1967, p. 87.

*Primary Examiner*—L. Dewayne Rutledge
*Assistant Examiner*—Alan E. Schiavelli
*Attorney, Agent, or Firm*—John A. Fisher

[57] ABSTRACT

A structure is provided which affords radiation protection to semiconductor devices and which specifically prevents soft failures in semiconductor memories caused by alpha particle radiation. The protection is provided by a metallic radiation shield formed on but insulated from the semiconductor memory array. The radiation shield is formed on the semiconductor devices while they are still in wafer form but after the normal device fabrication has been completed.

6 Claims, 9 Drawing Figures

METHOD FOR PROTECTING A SEMICONDUCTOR DEVICE FROM RADIATION INDIRECT FAILURES

BACKGROUND OF THE INVENTION

This invention relates in general to a radiation shield for a semiconductor device and more particularly to an alpha particle radiation shield for a semiconductor memory device.

A semiconductor memory provides a means for storing a large number of bits of information on a single semiconductor chip. Each bit of information is typically stored as charged on a capacitor, an amount of charge stored in a depletion well, or by causing a storage element to latch in a designated state.

As memories become more dense and more information is stored on a single chip, a "soft" failure mechanism is becoming increasingly important. This soft failure is caused by radiation, usually alpha particles, striking the semiconductor memory, generating hole-electron pairs, and discharging or altering the memory state of random bits.

The high density of present day memories increases the probability that an alpha particle which strikes the device chip will interfere with and disrupt a memory bit. The problem is exacerbated by the samll size of the storage element associated with the dense memory.

The source for the alpha particles causing the problem is the package itself. The semiconductor device chip is mounted in a package which protects the chip, allows the device to be easily handled, and facilitates electrical contact to the device. The material from which conventional semiconductor device packages are fabricated, however, contains trace amounts of radioactive material which emits alpha radiation.

The amount of radioactive material in a given package and the amount of alpha radiation from that material is extremely small, but the probability of an alpha particle causing a soft failure during many hours of memory operation is significant. Only one alpha particle causing one bit of the memory to be changed in state brings into question the integrity of all the information stored in the memory.

Because of the problem associated with radiation induced soft failures, it has become necessary to find some method for shielding the device from the failure causing radiation. Because the radiation emanates from the package itself, it is necessary that the radiation shield be applied directly to the device, or at least between the semiconductor device chip and the package. One proposed solution to the soft failure problem has been to apply a thick layer of polyimide over the surface of the die. Thick layers of polyimide have provided a degree of alpha particle protection, but have not been altogether satisfactory from the standpoint of reliability and ease of manufacturability. Polyimides have a relatively low density and thus must be applied in thick layers to provide a barrier to alpha particles. It is difficult to apply and to cure such thick layers of polyimide; the thick polyimide cannot be applied easily to the device while in wafer form. While some packaging techniques allow the polyimide to be applied to an individual device during the packaging operation, this cannot be readily done with all packaging techniques. Some techniques, for example, require high temperatures (greater than about 450° C.) during the package sealing operation. Such high temperatures are incompatible with the polyimide.

Accordingly, in view of the need to find a radiation barrier to protect the integrity of semiconductor memories and in view of the problems encountered with present techniques employing polyimide barriers, it was necessary to provide a unique radiation barrier which would overcome these prior art difficulties.

It is therefore an object of this invention to provide an improved protection for preventing radiation-induced failures in a semiconductor device.

It is a further object of this invention to provide an improved method for protecting a semiconductor device from radiation-induced failures.

It is a still further object of this invention to provide an improved radiation shield which can be applied to a semiconductor device in wafer form.

It is another object of this invention to provide an alpha particle radiation shield for a semiconductor device which is amenable to high temperature device packaging.

It is yet another object of this invention to provide an improved method for applying a temperature resistant radiation shield to the surface of a semiconductor device.

SUMMARY OF THE INVENTION

These and other objects of the invention are achieved through a unique structure in which a metallic radiation shield is applied directly over but insulated from the surface of the semiconductor memory. In one embodiment of the invention, normal processing of the semiconductor memory in wafer form is completed. This normal processing includes an insulating passivation glass covering the surface of the memory. A metallic radiation shield is formed on the passivation layer, over but insulated from the memory array. The shield is formed to a thickness sufficient to stop alpha particles, preventing them from causing radiation-induced failures in the memory. This shield is highly manufacturable because it is applied in wafer form, and because it permits the conventional packaging of the semiconductor device.

DETAILED DESCRIPTION OF PREFERRED EMBODIMENTS

Figure 1:
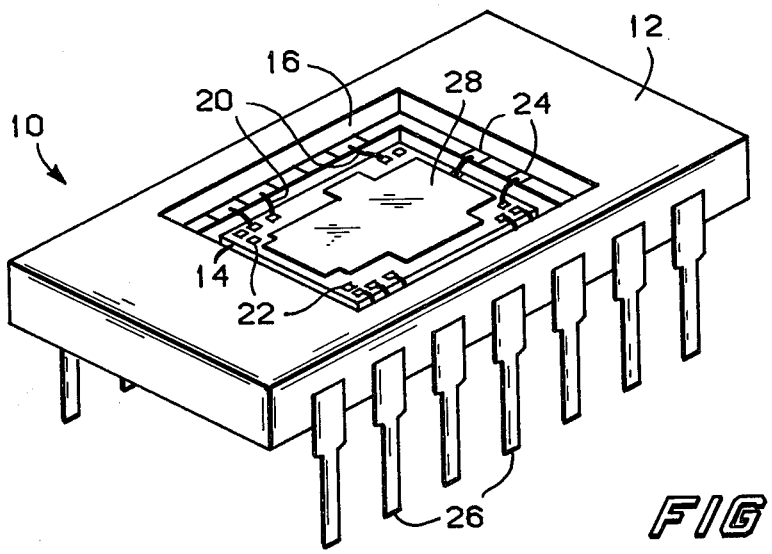
FIG. 1 illustrates a packaged semiconductor device having a radiation shield in accordance with the invention.

FIG. 1 illustrates a semiconductor device 10 which includes a semiconductor memory function. For illustrative purposes, the device is shown in a side-brazed ceramic package 12 in which a semiconductor device chip 14 is mounted. The chip is mounted in a cavity 16 provided in the package. The completed package will have a protective cover (not shown in this Figure) which serves to enclose the device chip within the cavity. Bonding wires 20, extending from bonding pads 22 on the device chip to lands 24 at the edge of the package cavity, electrically interconnect the device to the outside package leads 26.

Embodied within the semiconductor device chip is the desired circuit function. The function can be, for example, a static or dynamic memory such as a random access memory (RAM). Additionally, the function may be, for example, a microprocessor unit which includes a memory as part of the functional unit. The device can be implemented in a number of semiconductor technologies including bipolar, MOS, and CCD. Without protection, the memory portion of the chip is susceptible to soft failures resulting from radiation such as alpha particle radiation which emanates from impurities within the packaging material. By "soft failure" is meant a memory disturb as opposed to a failure resulting from a permanent physical defect. In a soft failure the memory information stored in the memory bit is altered or disturbed by the radiation. Information can be read into or out of the bit upon subsequent reprogramming.

In accordance with the invention, radiation induced soft failures are prevented by forming a metallic radiation shield 28 over at least the memory portions of the semiconductor device chip. The metallic radiation shield is formed on the surface of the semiconductor device and is isolated from the underlying electronic circuit by an intervening insulator layer (which cannot be seen in this view). The metallic radiation shield is patterned to avoid interference with the normal wire bonding to bond pads 22.

Figure 2:
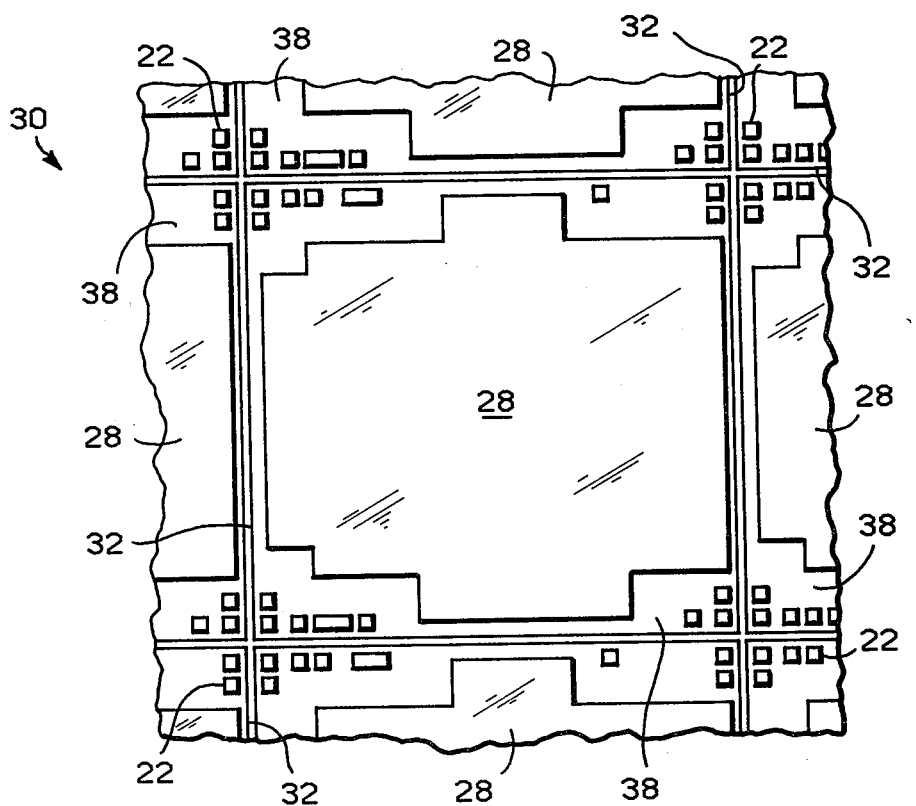
FIG. 2 illustrates a semiconductor wafer having radiation shields formed over semiconductor devices.

FIG. 2 illustrates the invention in more detail. A portion of a semiconductor wafer 30 is shown on which are fabricated a plurality of semiconductor devices 32. The devices can be, for example, ECL RAMS having a memory capacity of one thousand bits. The device includes a memory array and a number of peripheral circuits such as input and output buffers, address buffers, and the like. Bonding pads 22 are located around the periphery of each die.

Covering each die is a layer of insulator 38 such as phosphorus-doped silica glass, polyimide, or the like. This layer normally provides scratch protection as well as protection from contaminants. In this embodiment of the invention, the insulating layer also provides electrical insulation between the radiation shield 28 and the underlying electronic circuit. Holes through the insulating layer provide for normal contact to the bonding pads. The metallic radiation shield 28 is located directly on the insulating layer and covers at least the memory array portion of the semiconductor device.

It is not mandatory that the radiation shield also cover all of the peripheral circuits. It is usually preferable from a manufacturability standpoint to have the radiation shield in a more or less regular rectangular array sufficiently large to adequately cover the memory portion of the chip and to be sufficiently spaced from the bonding pads so as not to interfere with the subsequent wire bonding operation.

Figure 3:
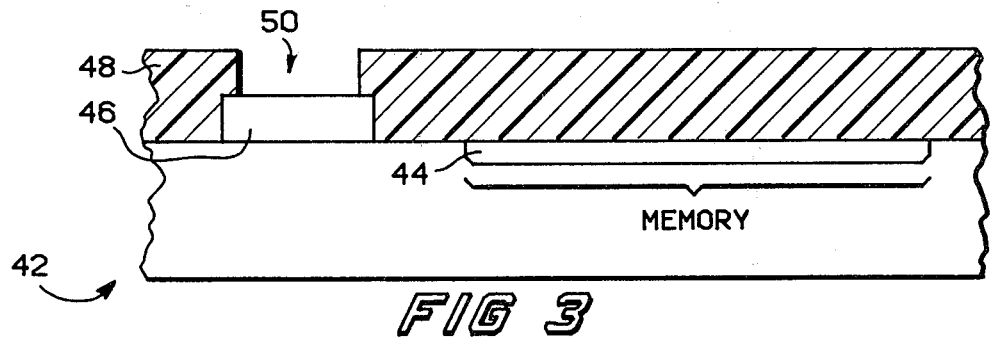
FIGS. 3–5 illustrate one process for forming the radiation shield.
Figure 4:
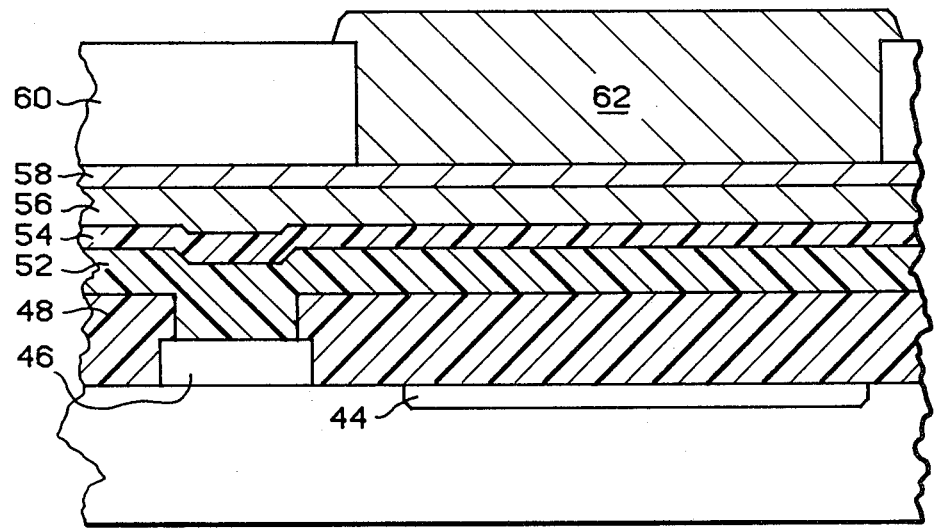
Figure 5:
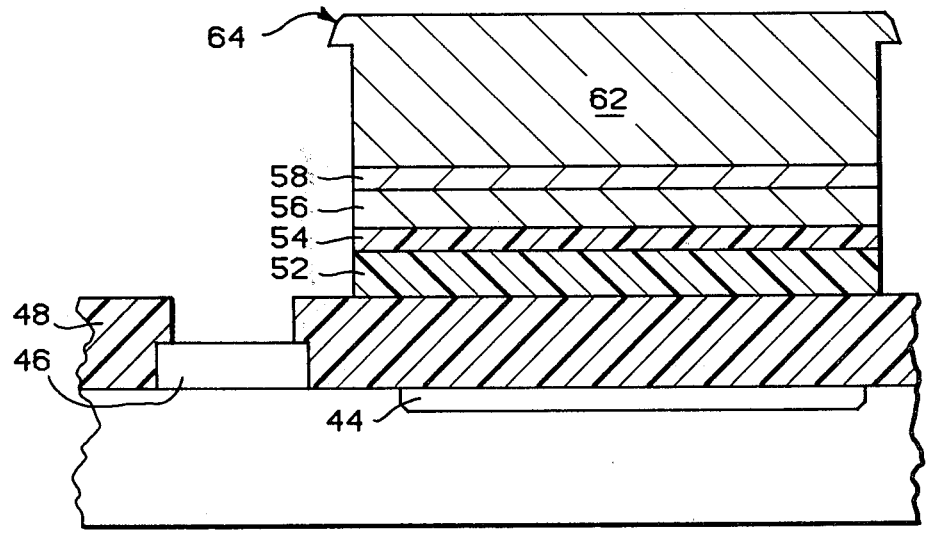

FIGS. 3–5 illustrate one process for providing a metallic radiation shield in accordance with the invention. FIG. 3 shows in cross section a portion of a semiconductor wafer 42 in which a plurality of semiconductor devices are formed. A semiconductor memory located in the region designated by the line 44 is fabricated in the wafer. The memory is formed of bipolar or MOS transistors and the like as is well known in the semiconductor art. Located on the surface of the wafer are a plurality of bonding pads 46 which are connected in known manner to the semiconductor device. Insulating layer 48 covers the surface of the wafer except for the bonding pads which are exposed through apertures 50 in the insulator.

FIG. 4 illustrates one method by which the completed semiconductor device is provided with a metallic radiation shield. In this embodiment the bonding pads and insulating layer 48 are covered with a polyimide layer 52 of about 1.5 micrometer thickness. The polyimide layer is optional, but together with the insulator 48 insures complete electrical isolation between the semiconductor surface at which the memory is located and the subsequent metal layers. A layer of silicon dioxide 54 having a thickness of about 0.1 micrometer is deposited over the polyimide layer by a low temperature deposition process. The oxide layer, and the optional polyimide layer, cover and protect the bonding pads during the subsequent processing steps.

Over the oxide layer is deposited first a layer 56 of chromium and then a layer of copper 58. The two layers can conveniently be deposited by sequential sputtering operations. The chromium, which has a thickness of about 0.3 micrometers, is used because it adheres well to the underlying oxide 54 and because it forms a barrier layer preventing copper migration to the semiconductor surface where it might deleteriously affect device performance. Thin copper layer 58 is used to promote the subsequent copper deposition.

A layer of dry film photoresist 60 such as Riston, a product of the E. I. DuPont de Nemours and Company, is applied over the sputtered copper layer. The photoresist layer is patterned photolithographically to remove the layer from those portions of the circuit over which the radiation shield is to be placed. A layer of photoresist thus remains over those portions of the circuit such as the bonding pads which are to be kept free of the radiation shield.

Using the dry film photoresist as a mask, a thick layer of copper 62 is electrolytically plated on the wafer to a thickness of several micrometers. A thickness of about 4.5 to 5.5 micrometers and preferably about 5 micrometers, for example, is sufficient to stop a 5 Mev alpha particle.

After plating the copper to the desired thickness, the photoresist can be removed in a conventional photoresist stripping solution. The thick copper is then used as an etch mask to remove the layers which have been applied over the bonding pads. Thin copper layer 58 is etched, for example, in ammonium persulfate; chromium layer 56 in sulfuric acid; oxide layer 54 in a mixture of ammonium fluoride, acetic acid and water; and polyimide layer 52 in an organic solvent. After etching these layers, the wafer appears substantially as shown in FIG. 5. The metallic radiation shield 64 covers the memory circuits 44. This shield is positioned away from the bonding pads 46 so as not to interfere with subsequent bonding operations. While most of the radiation protection is provided by the thick copper 62, radiation shield 64 also includes the underlying thin copper and chromium.

The radiation shield as shown in FIG. 5 provides radiation protection for alpha particles having an energy up to about 5 Mev. The shield has the disadvantage, however, that the plated copper 62 is susceptible to oxidation. In some package sealing operations, and especially those requiring temperatures up to about 450° C., there is a tendency for a copper oxide to form on the surface of the radiation shield. The copper oxide does not appreciably affect the radiation shielding properties of the shield but has an undesirable cosmetic effect.

An alternate embodiment of the invention overcomes the above-described cosmetic disadvantage of the thick copper radiation shield. This alternate embodiment, illustrated in FIGS. 6-8, is applied to a normally completed semiconductor device wafer as that illustrated in FIG. 3.

Figure 6:
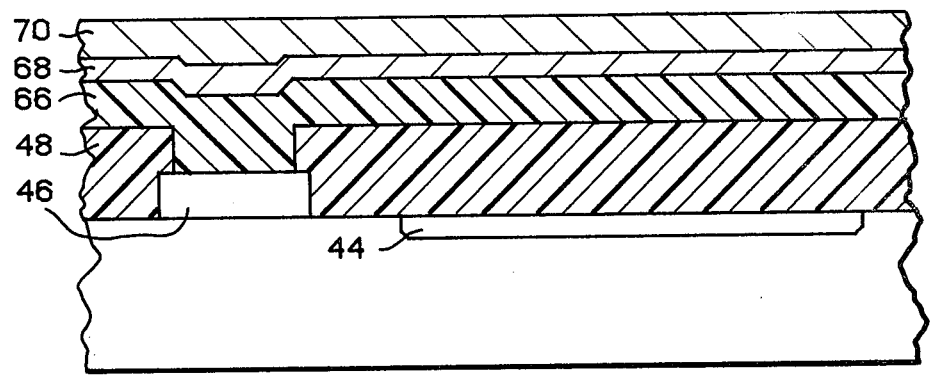
FIGS. 6–8 illustrate a further process for forming the radiation shield.

As illustrated in FIG. 6, the completed device wafer structure is covered with a layer 66 of low temperature deposited glass having a thickness of about 0.2 micrometers. This layer of glass protects the bonding pads 46 during the subsequent processing steps. Over the glass layer is deposited a layer of chromium 68 and a thin layer of copper 70. As above, these layers are preferably deposited by sequential sputtering operations. The chromium is used as a barrier layer and because of its good adhesion to the underlying glass layer. The copper is used to promote the subsequent deposition.

Figure 7:
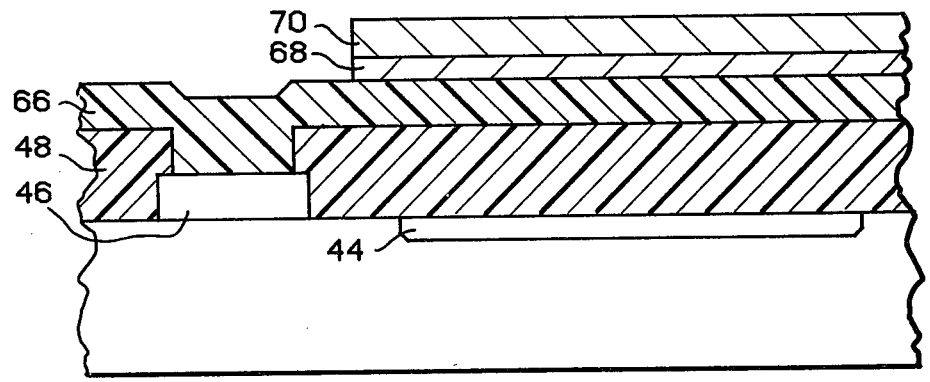

As illustrated in FIG. 7, the chromium and copper layers are patterned photolithographically to remove those layers except in locations which require the metallic radiation barrier. Using positive photoresist as an etch mask, copper layer 70 is etched in ammonium persulfate. The chromium 68 is preferably etched electrolytically in sulfuric acid. The electrolytic etching is used to speed the etching process since the sulfuric acid also attacks the photoresist mask. Glass layer 66 is not patterned and is left protecting the bonding pads.

Figure 8:
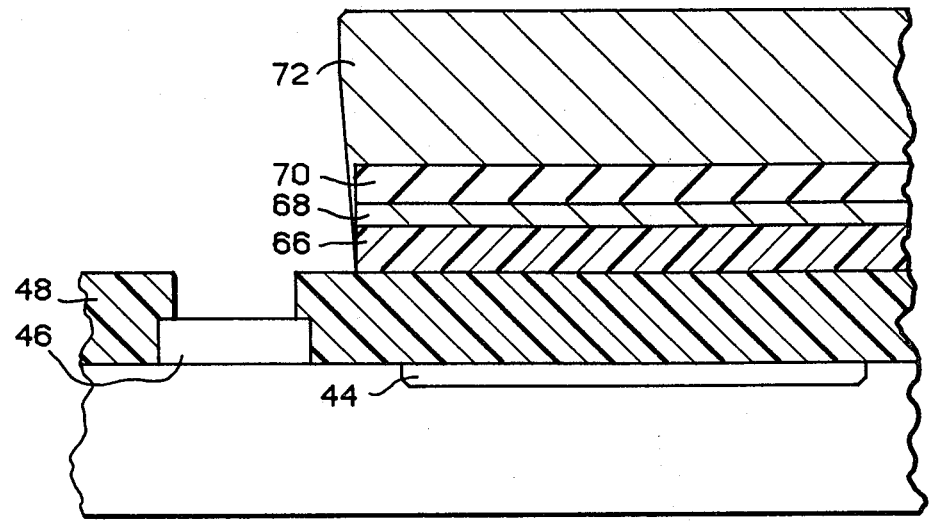

Using an electroless nickel plating process, a thick layer of nickel 72 is plated over the copper and chrome to complete the radiation shield as illustrated in FIG. 8. The plating process includes first activating the surface of copper layer 70 in a conventional strike solution that promotes electroless plating to the copper but not to the glass layer 66. After soaking in the strike solution for about two minutes, the nickel is plated from a standard electroless phosphorus-nickel plating bath. The nickel is preferably plated to a thickness of about 4.5 micrometers or more. The nickel layer should not be too thick, however, as layers greater than about 8 micrometers tend to peel off during the subsequent die bonding. After the plating, glass layer 66 is removed from the bonding pads by etching in a dilute oxide etchant using the metal radiation shield as an etch mask.

Figure 9:
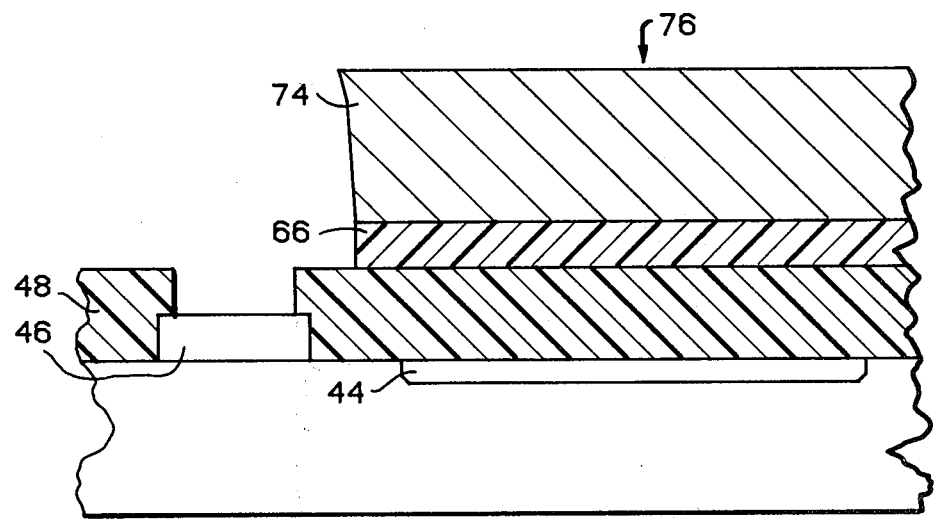
FIG. 9 illustrates yet another embodiment of the radiation shield.

In a still further embodiment, the end result of which is illustrated in FIG. 9, a thin glass layer such as layer 66 is deposited over the completed device wafer structure to protect the bonding pads as described above. A layer of aluminum 74 having a thickness greater than about 17 micrometers is then deposited onto the glass layer, for example, by vacuum evaporation. Aluminum layer 74 is patterned using conventional photolithography to leave an aluminum radiation shield 76 positioned over the memory portions of the semiconductor circuit. The aluminum is etched in a phosphoric acid based etchant. After etching the aluminum the thin glass layer is removed from the bonding pads using the patterned aluminum as an etch mask.

The ability of metals to stop an alpha particle is approximately proportional to the density of the metal. To stop a 5 Mev alpha particle, for example, requires about 4.5 to 5.5 micrometers of copper or nickel, about 17 micrometers of aluminum, and more than 30 micrometers of polyimide. In comparison to polyimides, much thinner layers of copper, nickel, or aluminum are therefore required to stop an alpha particle of a given energy.

To test the effectiveness of the metallic radiation shield, a number of semiconductor devices are subjected to a Thorium 228 alpha particle source. The devices, 1K ECL RAMs, are divided into a control group processed conventionally without radiation shields and a group having radiation shields in accordance with the invention but otherwise similar to the control group. A memory pattern is written into each array and is subsequently read at a repetition rate of 1000 times per second. The Thorium 228 source is placed directly over the packaged die (from which the cover has been removed) for three minutes. The number of device memory failures that occur during the three minutes is recorded. Each of the unshielded die has at least one soft memory failure with some devices failing tens of times. None of the devices having a radiation shield in accordance with the invention fails. Similarly, no failures occur for the shielded devices when the Thorium source is oriented at 20 degrees and 45 degrees with respect to the surface of the die and the test is continued for thirty minutes of exposure.

Semiconductor memory devices protected with a metallic radiation shield in accordance with the invention are further tested under standard operating conditions. No decrease in memory access time is detected. The presence of a metallic plate electrically floating in close proximity to the upper surface of the memory does not degrade the memory's speed. Apparently an insignificant amount of capacitive coupling occurs between the circuit and the metal shield.

Thus there has been provided, in accordance with the invention, a metallic radiation shield and a method for protecting a semiconductor device from radiation induced failures which fully meets the objects and advantages set forth above. While the invention has been described in conjunction with specific embodiments thereof, it is not intended that the invention or its use be so limited. Other methods for applying and patterning the metallic layers which comprise the radiation shield, for example, as well as the use of other metals and combinations of metals, will be apparent to those skilled in the art in the light of the foregoing description. Accordingly, it is intended to embrace all such variations and modifications as fall within the scope of the invention.

I claim:

1. A method for forming a radiation shield to protect a semiconductor device from radiation induced failures, said semiconductor device formed at a surface of a semiconductor wafer and including on said surface device metallization and bonding pads, said method comprising the steps of: forming an insulating layer overlying said surface; forming a metal layer on said insulating layer by sequential depositions of chromium and a first copper layer followed by the electrolytic plating of a second copper layer, said insulating layer providing electrical isolation between said metal layer and said device metallization; and patterning said metal layer to allow bonding to said bonding pads.

2. The method of claim 1 wherein said second copper layer has a thickness of about 4.5 to 5.5 micrometers.

3. The method of claim 1 wherein said step of patterning said metal layer comprises forming a patterned dry film photoresist on said first copper layer to limit said electrolytic plating and subsequently using said second copper layer as an etch mask for said first copper layer and said chromium.

4. A method for forming a radiation shield to protect a semiconductor device from radiation induced failures, said semiconductor device formed at a surface of a semiconductor wafer and including on said surface device metallization and bonding pads, said method comprising the steps of: forming an insulating layer overlying said surface; forming a metal layer on said insulating layer by sequential depositions of chromium and copper followed by the electroless plating of a nickel layer, said insulating layer providing electrical isolation between said metal layer and said device metallization; and patterning said metal layer to allow bonding to said bonding pads.

5. The method of claim 4 wherein said nickel layer has a thickness of about 4.5 to 5.5 micrometers.

6. The method of claim 5 wherein said step of patterning said metal layer comprises photolithographically patterning said chromium and copper and activating said patterned copper to preferentially nickel plate on said activated patterned copper.

* * * * *